US006256358B1

(12) United States Patent
Whikehart et al.

(10) Patent No.: US 6,256,358 B1
(45) Date of Patent: Jul. 3, 2001

(54) DIGITAL SIGNAL PROCESSING ARCHITECTURE FOR MULTI-BAND RADIO RECEIVER

(75) Inventors: J. William Whikehart, Novi; James Alfred Wargnier, Chesterfield; Bradley Anderson Ballard, Belleville; Nicholas Lawrence Difiore, Farmington Hills; John Elliott Whitecar, Plymouth, all of MI (US); Christopher John Hagan, Colorado Springs, CO (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/049,355

(22) Filed: Mar. 27, 1998

(51) Int. Cl.$^7$ ............................... H04H 1/06; H04L 27/06
(52) U.S. Cl. ........................ 375/316; 455/144; 455/142; 455/130; 329/315; 329/347; 329/372
(58) Field of Search ........................... 375/316; 329/315, 329/347, 372; 455/130, 142, 144

(56) References Cited

U.S. PATENT DOCUMENTS

| 3,639,848 | * | 2/1972 | Elliott ................................ 708/306 |
| 4,470,147 | * | 9/1984 | Goatcher ............................ 375/321 |
| 4,592,074 | * | 5/1986 | Whikehart ......................... 375/316 |
| 4,731,796 | * | 3/1988 | Masterton et al. ................ 375/223 |
| 4,893,316 | * | 1/1990 | Janc et al. ......................... 708/300 |
| 5,375,146 | * | 12/1994 | Chalmers .......................... 375/350 |
| 5,490,173 | * | 2/1996 | Whikehart et al. ............... 375/316 |
| 5,640,424 | * | 6/1997 | Banavong et al. ................ 375/316 |
| 5,640,698 | * | 6/1997 | Shen et al. ........................ 375/316 |
| 5,732,337 | * | 3/1998 | Wargnier et al. ................. 455/144 |
| 5,859,878 | * | 1/1999 | Phillips et al. ................... 375/316 |

FOREIGN PATENT DOCUMENTS

| 0 254 844 A2 | | 6/1987 | (EP) . | |
| 0 924 864 A2 | * | 6/1999 | (EP) | ............................ H04B/1/00 |
| 2 114 840 | | 2/1982 | (GB) . | |
| 2 114 840 | * | 8/1982 | (GB) | ............................ H03K/3/00 |
| 0 254 844 A2 | * | 6/1986 | (GB) | ............................ H03D/7/00 |
| 86/05936 | * | 10/1986 | (WO) | ........................... H04B/1/04 |
| 87/07099 | * | 11/1987 | (WO) | ........................... H04B/1/10 |

OTHER PUBLICATIONS

Arthur G. Stephenson, "Digitizing Multiple RF Signals Requires an Optimum Sampling Rate" Electronics, Mar. 27, 1972.*
Hosking, Roger H., Digital Receivers: The New Wave for Signal Analysis, RF Design, Apr. 1997, Atlanta GA.*
Olmstead, Clay and Petrowski, Mike, Digital IF Processing, RF Design, Sep. 1994, Atlantia, GA*
Hosking, Rodger H, Digital receivers: The new wave for signal analysis, RF Design, Apr., 1997, Atlanta, GA.
Olmstead/Petrowski, Harris Semiconductor, Digital IF Processing, RF Design, Sep., 1994, Atlanta GA.
Entertainment and information merge in the automobile, William C. Spelman, IEEE Vehicular Technology Society News, Feb., 1996, pp. 49–55.

* cited by examiner

Primary Examiner—Stephen Chin
Assistant Examiner—Paul N Rupert
(74) Attorney, Agent, or Firm—Mark Mollon

(57) ABSTRACT

A digital signal processing architecture for an audio system combines multiple functions in programmable and reconfigurable blocks to achieve an efficient use of hardware and chip area. AM, FM, and audio functions can be performed using the same reconfigurable hardware while taking into account the different sample rates and processing functions required for each.

5 Claims, 4 Drawing Sheets

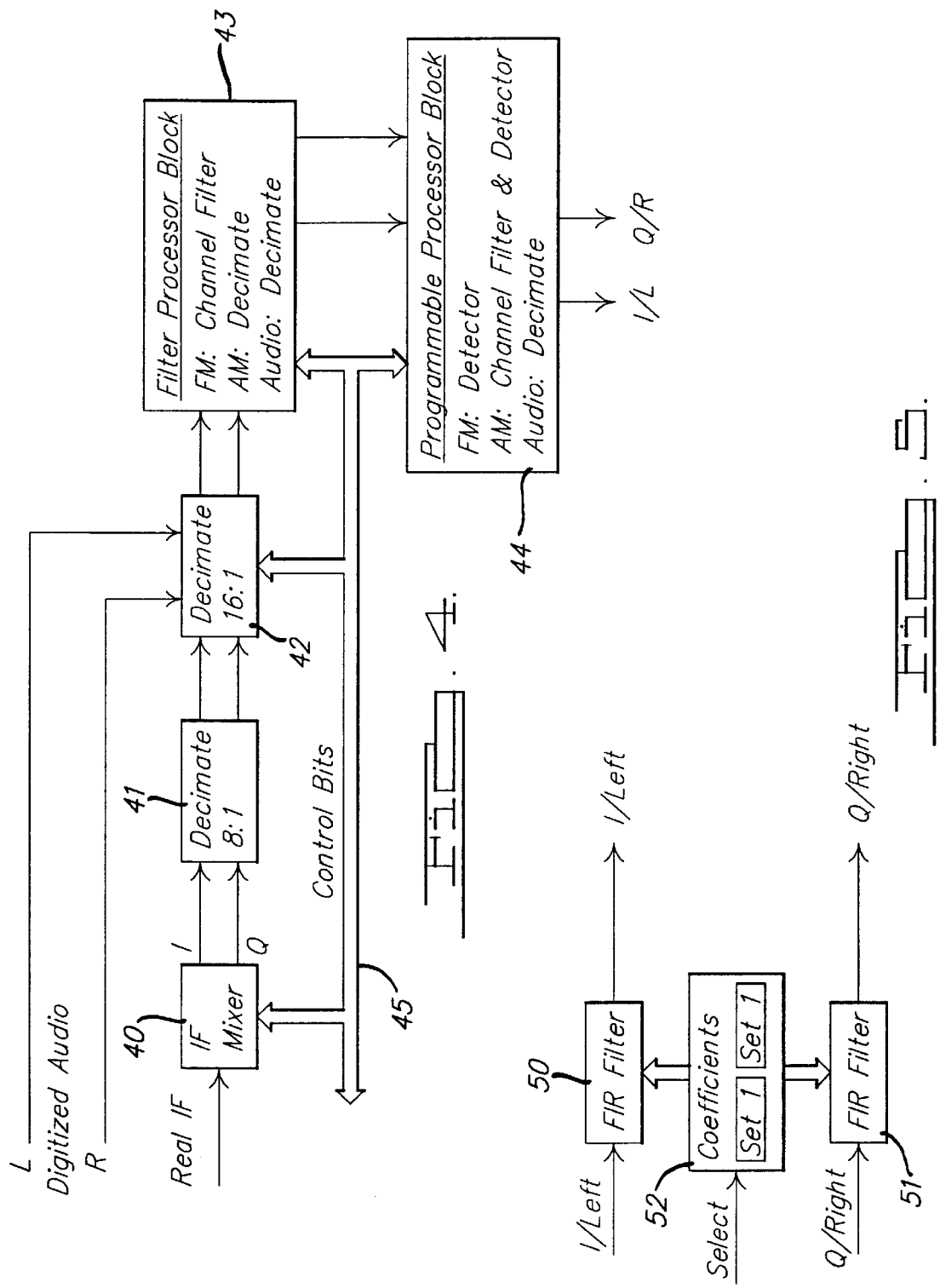

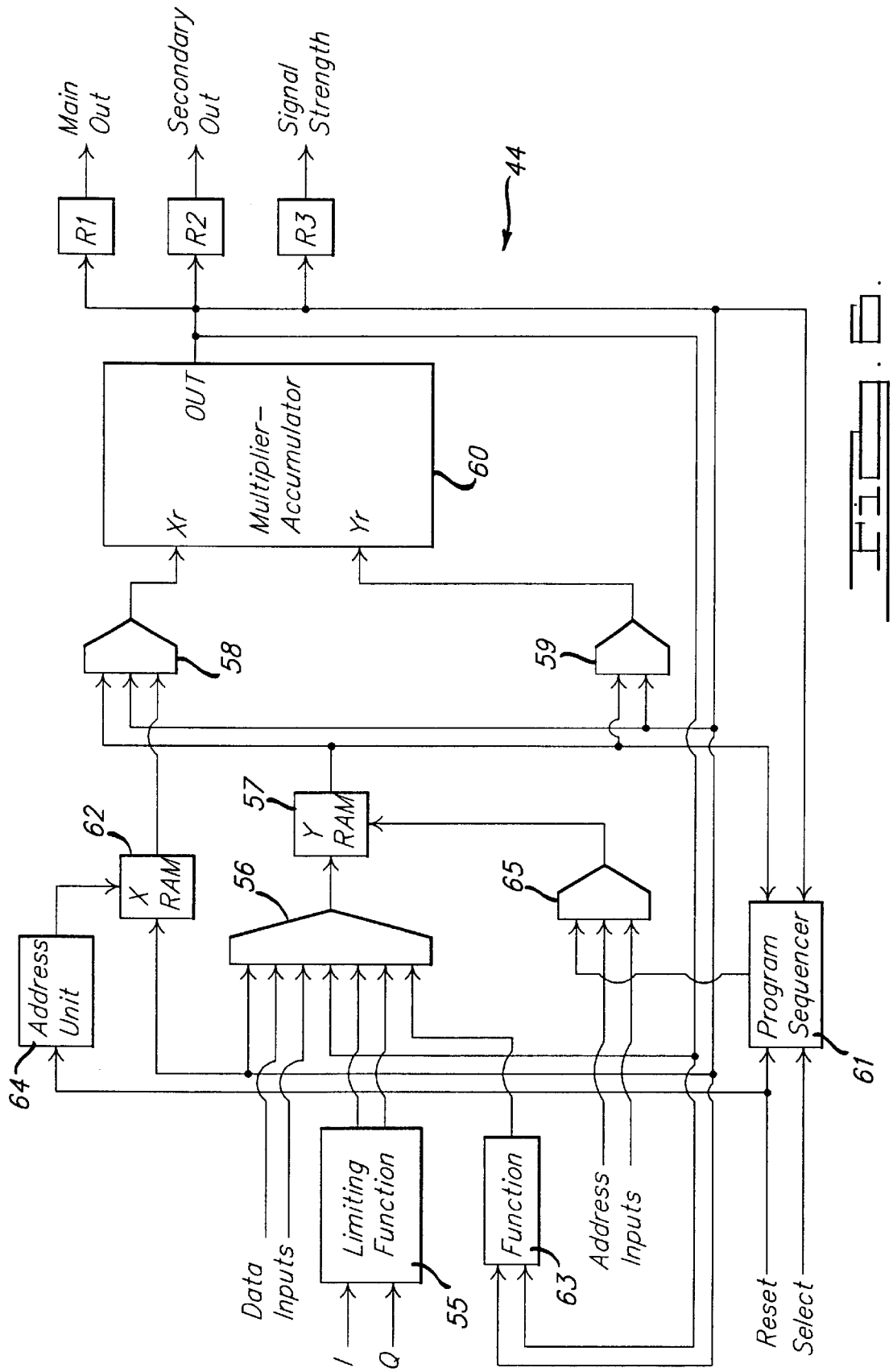

DIGITAL SIGNAL PROCESSING ARCHITECTURE FOR MULTI-BAND RADIO RECEIVER

BACKGROUND OF THE INVENTION

The present invention relates in general to digital signal processor integrated circuits, and more specifically, to a processing architecture having reconfigurable blocks to minimize integrated circuit area required to process multi-band radio signals, such as AM and FM.

With the advent of high speed digital signal processing (DSP) components, radio receivers are being introduced using DSP integrated circuits to implement demodulation and various other functions in a radio receiver. In particular, it is becoming possible to digitally process the intermediate frequency (IF) signal or even the radio frequency (RF) signal, thus avoiding a large number of analog circuits and components with their associated costs and space requirements. In order to keep costs down for a particular audio system, DSP performance in terms of 1) chip area required for processing, and 2) execution time, each need to be minimized.

DSP components are typically organized into blocks, each block performing a particular function such as decimating, filtering, or signal detection. In a multi-band radio receiver, the exact functions which must be performed to reproduce each different type of broadcast may be significantly different. For example, AM and FM broadcast signals are transmitted using different types of modulation and different bandwidths. Consequently, separate chains of processing blocks have been used in prior art DSP components to separately process AM and FM signals. This inefficient use of DSP chip area results in higher costs both for the DSP integrated circuits themselves and the audio systems which use them.

SUMMARY OF THE INVENTION

The present invention has the advantage of using a single chain of processing blocks in a DSP architecture for processing multi-band radio signals.

In a preferred embodiment, the present invention provides a digital signal processor for a multi-band radio receiver that processes audio signals from a radio tuner including a narrowband IF signal from a first broadcast band and a wideband IF signal from a second broadcast band. A half-complex mixer block is selectively responsive to the narrowband IF signal when the processor is in a narrowband mode, or the wideband IF signal when the processor is in a wideband mode, and generates a digital complex IF signal at a predetermined IF frequency and at a first sample rate. The complex IF signal includes an in-phase component and a quadrature-phase component. A decimator block having dual sections coupled to the half-complex mixer block decimates the respective in-phase and quadrature-phase components of the complex IF signal by a predetermined ratio. This produces a sample-rate reduced complex IF signal at a second sample rate. A reconfigurable digital filter block has dual sections each having selectable sets of filter coefficients. A first set of coefficients corresponds to the narrowband mode and a second set corresponds to the wideband mode. The first set of filter coefficients configures the digital filter block as a decimator to further reduce the sample rate of the sample-rate reduced complex IF signal to a third sample rate when in the narrowband mode. The second set of filter coefficients configures the digital filter block as a channel lowpass filter to reject undesired signals from the sample-rate reduced complex IF signal without further sample rate reduction when in the wideband mode. A programmable processor block receives outputs from the dual sections of the digital filter block. The programmable processor block includes a program memory and a program sequencer. The program memory contains a first executable code block for use in the narrowband mode and a second executable code block for use in the wideband mode. The first executable code block performs a channel filtering and narrowband detection function at the third sample rate. The second executable code block performs a wideband detection function at the second sample rate.

BRIEF DESCRIPTION OF THE DRAWINGS

FIG. 4 is a block diagram showing the DSP architecture of the present invention.

FIG. 5 is a block diagram showing the filter processor block of FIG. 4 in greater detail.

FIG. 6 is a block diagram showing the programmable processor block of FIG. 4 in greater detail.

DETAILED DESCRIPTION OF PREFERRED EMBODIMENTS

Figure 1:
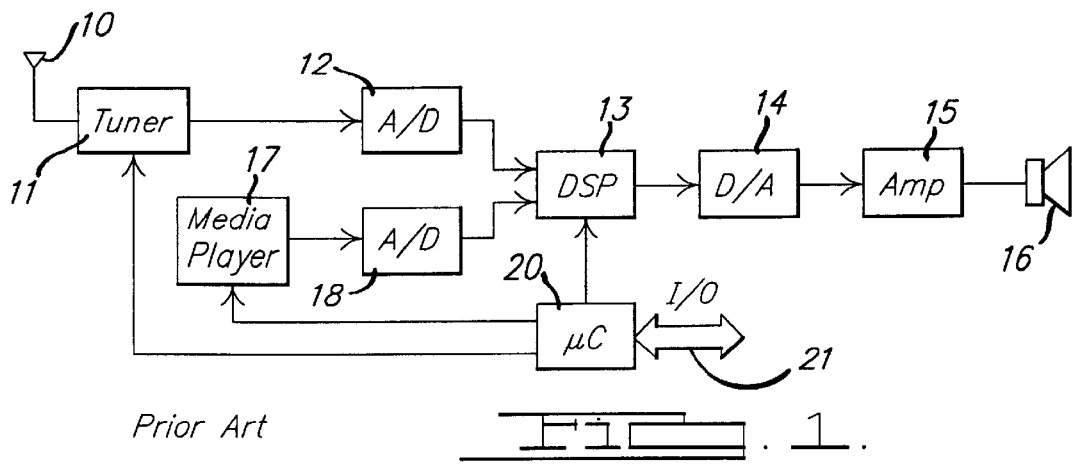
FIG. 1 is a block diagram showing a prior art DSP audio system.

FIG. 1 shows a DSP audio system of the type which is generally known in the art. RF broadcast signals are picked up by an antenna 10 and supplied to an analog radio tuner 11. Tuner 11 performs frequency translation and bandpass filtering to select and provide an RF or IF signal to an analog-to-digital (A/D) converter 12. The digitized signal is provided to a digital signal processor (DSP) 13. After processing to reproduce the audio information in the radio signal, DSP 13 provides an audio signal to a digital-to-analog (D/A) converter 14. The resulting analog audio signal is amplified in an amplifier 15 and reproduced using a speaker system 16.

The audio system of FIG. 1 also reproduces audio from prerecorded media (such as cassette tape, CD, DVD, or mini-disc) using a media player 17. A multiple-channel (e.g., stereo) audio signal is provided to an A/D converter 18 and the resulting digitized signals provided to DSP 13 for processing.

In order to avoid aliasing of the digital signals, A/D converters 12 and 18 preferably oversample their input signals. For example, an FM IF signal may be provided from tuner 11 having an intermediate frequency of about 10.7 MHz. The signal may preferably be oversampled using a sample rate of about 40 MHz. Although the intermediate frequency of the AM IF signal is typically only about 450 kHz, it too is preferably oversampled using the 40 MHz sample rate. The audio signal from media player 17 is similarly oversampled. Furthermore, a single A/D converter could be used for both the tuner and the media player, if desired.

A microcontroller 20 is connected to tuner 11, media player 17, and DSP 13 for controlling and coordinating operation of the audio system. Microcontroller 20 receives and sends various input and output signals over I/O connections 21. For example, the audio system may comprise push buttons, knobs, and visual displays as is known in the art for allowing user interaction with the audio system.

Figure 2:
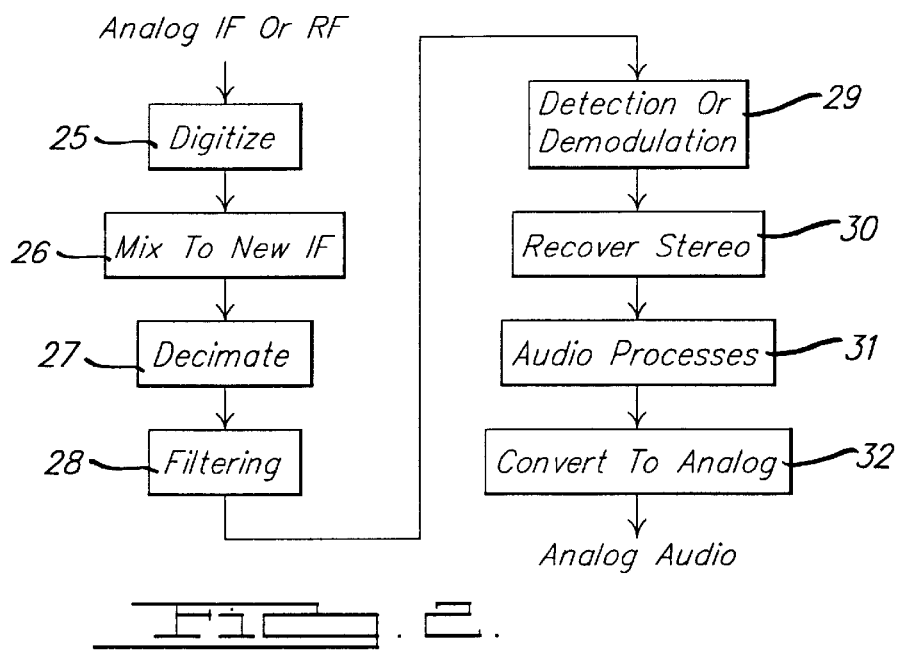
FIG. 2 is a flow chart showing typical DSP functions which must be performed to reproduce signals from a radio tuner.

The typical processing required for reproducing radio broadcasts using a DSP system is shown in FIG. 2. An analog IF or RF signal from a radio tuner is digitized in step 25. In step 26, the digitized radio signal is mixed to a new intermediate frequency. For purposes of digital processing, an IF frequency of about 0 hertz represented as in-phase and quadrature-phase components is preferred.

In step 27, the IF signal is decimated (i.e., down-sampled). Digitally processed signals are over-sampled at digitization step 25 in order to reduce aliasing of undesired signals onto the desired signal. Since digitized signals can be more easily filtered to reduce frequencies outside the frequency range of the desired signal, it is well known to oversample and to perform most filtering in the digital domain. Decimating then reduces the sample rate prior to most of the rest of the processing of the signals to simplify the DSP circuits and to reduce chip area. Filtering performed in step 28 isolates the radio channel of interest.

Detection (i.e., demodulation) of the IF signal is performed in step 29. If the radio broadcast is a stereo signal, then the stereo information is recovered in step 30 by further stereo detection according to the manner in which the stereo information is encoded (e.g., a subcarrier for FM and quadrature phase modulation for AM). The audio signals are processed through additional audio processes in step 31, such as controlling balance, fade, tone, or concert hall emulation. The processed audio signals are converted back to analog in step 32.

Although processing radio signals may generally require following the steps of FIG. 2, the specific details of each step may be significantly different depending upon the broadcast band (e.g., AM or FM) of any particular radio signal. In addition to different modulation types, a significantly different bandwidth may be utilized by the respective IF signals.

Figure 3:
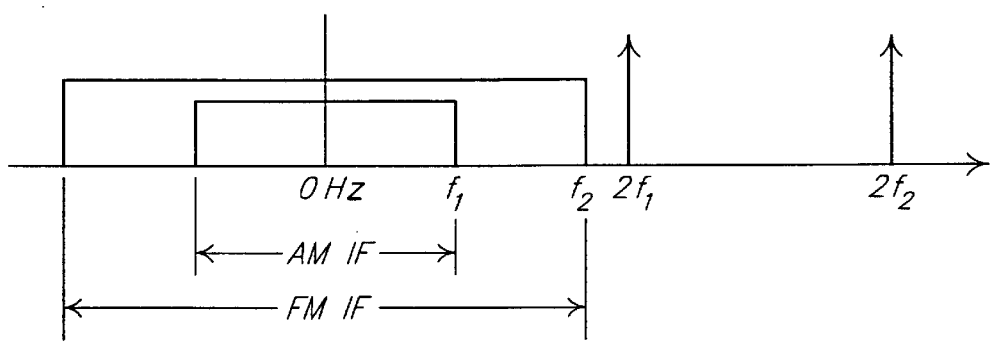
FIG. 3 is a frequency diagram showing the bandwidth of AM and FM IF signals.

FIG. 3 shows the IF bandwidths for AM and FM (based on U.S. frequency allocations) after mixing to a zero-hertz IF frequency. Thus, an AM IF signal is centered on zero hertz and has an upper frequency of $f_1$. The FM IF signal is also centered at zero hertz and has an upper frequency of $f_2$. In order to accurately represent a signal in digital form, the sampling rate must be at least twice the highest frequency component of the signal. Thus, the sample rate must be greater than or equal to $2f_1$ for the AM IF and must be greater than or equal to $2f_2$ for the FM IF signal. Thus, demodulation of the FM signal must occur at a higher sampling rate than the minimum sampling rate at which the AM signal can be demodulated.

It is desirable to perform each processing step at the lowest sample rate practical in order to minimize the size of the processing blocks. Thus, the differences in sample rate necessary and the differences in processing AM and FM signals have resulted in prior art architectures using separate signal chains to convert AM and FM signals to baseband audio signals.

FIG. 4 shows a preferred embodiment of the present invention wherein AM, FM, and audio from prerecorded media share a chain of processing blocks, wherein certain blocks are reconfigurable to process each different signal in an optimum manner.

An IF mixer 40 receives the real (non-complex) digitized IF signal which may be either an FM IF signal having a center IF frequency at about 10.7 MHz, or an AM IF signal having a center IF frequency at about 450 kHz. IF mixer 40 is a half-complex mixer block which generates a digital complex IF signal at a predetermined IF frequency (often called a second IF frequency) of about zero hertz and at a first sample rate (typically about 40 MHz). IF mixer 40 produces an in-phase component I and a quadrature phase Q, in a complex representation of the IF signal. The I and Q component signals are decimated in a pair of decimator blocks 41 and 42. Preferably, decimator block 41 reduces the sample rate at a ratio of about 8 to 1 and decimator block 42 reduces the sample rate at a ratio of about 16 to 1. At the output of decimator 42, the complex IF signal will have been sample-rate reduced to a second sample rate of about 312.5 kHz in this example.

Decimate block 42 also receives stereo left and right digitized audio signals corresponding to a prerecorded media. Thus, decimate block 42 has selectable inputs between either the digitized prerecorded audio or the complex IF signal from decimate block 41.

The decimated output of decimate block 42 is provided to the dual inputs of a filter processor block 43. These inputs correspond to either decimated I and Q components of a complex IF signal or decimated left and right digitized audio signals. Filter processor block 43 is a reconfigurable digital filter which can perform the function of a channel filter while in FM mode, a decimate block while in AM mode, or a decimate block while in audio mode.

The dual outputs from filter processor block 43 are coupled to a programmable processor block 44 which functions as an FM detector in FM mode, a channel filter and AM detector in AM mode, and a decimator in audio mode. Programmable processor block 44 preferably includes executable code for performing its various functions in DSP. Thus, one executable code block would be used for FM detection while a separate executable code block would be used for channel filtering and AM detection, and yet another executable code block would be used for decimating stereo audio signals. Furthermore, various portions within programmable processor block 44 operate at different sample rates depending upon which mode is being executed. For example, FM detection is performed at a higher sample rate due to the higher frequencies and wider bandwidth of the FM IF signal. Channel filtering and AM detection is performed at a lower sample rate, thereby allowing both functions to be performed without increasing the processing capacity of the block.

More specifically, the bandwidth of the FM IF signal using a zero IF representation is 100 kHz, which corresponds to one-half of the 200 kHz channel spacing in the FM broadcast band. Thus, a minimum sample rate for processing the FM IF signal at zero IF frequency is about 200 kHz. A sample rate of about 312.5 kHz is obtained at the output of decimate block 42 and is preserved throughout filter processor block 43 when in the FM mode. Thus, programmable processor block 44 operates at this sample rate while in the FM mode. In contrast, the channel spacing in the AM broadcast band is only 10 kHz in the U.S. (9 kHz in Europe) resulting in an AM IF signal bandwidth which may be processed at a much lower sample rate. Thus, programmable processor block 44 can operate at a lower sample rate while implementing more functionality (i.e., simultaneous channel filtering and AM detection) in the AM mode.

Control bits provided over a communication bus 45 are connected to IF mixer 40, decimate block 42, filter processor block 43, and programmable processor block 44 to coordinate the operating mode of the DSP in response to the microcontroller (not shown). Efficient use is made of all of the processing resources in the processing blocks of FIG. 4 by separating and reconfiguring functions within each mode for the type of signal currently being processed. Thus, in the FM mode which must operate at a higher sample rate throughout more of the processing chain, filter processor block 43 and programmable processor 44 share the channel filtering and detection functions. Since in the AM mode, channel filtering and detection can be operated at a lower sample rate so that both can be performed in programmable processor block 44, filter processor block 43 assumes the job of the additional decimation that is required. When in the audio mode, the same DSP resources are converted to the decimation needed to remove the oversampling of the digitized prerecorded audio signals.

Filter processor block 43 is shown in greater detail in FIG. 5. The filter processor block is shown as using finite impulse response (FIR) filters, although other digital filter types could also be used such as an infinite impulse response (IIR) filter. Filter processor block 43 includes dual sections for processing the I and Q signals or the left and right audio signals. The I or left signal is input to a first FIR filter 50. The Q or right signal is input to a second FIR filter 51. FIR filters 50 and 51 are preferably implemented using tapped delay lines as is known in the art. The proportional contribution of each filter tap to be summed into the filter output is determined by a set of coefficients supplied from a coefficient memory 52. A first set of coefficients for FIR filters 50 and 51 configures FIR filters 50 and 51 as a decimator adapted to reduce the sample rate of the AM IF signal when in the AM mode. A second set of filter coefficients configures FIR filters 50 and 51 as a channel lowpass filter to reject undesired signals from the FM IF signal without further sample rate reduction when in the FM mode. The first set of coefficients can also be used in the audio mode to provide decimation at the same desired ratio. Alternatively, a unique set of coefficients could be provided for the audio mode.

In the preferred embodiment, filter processor block 43 performs its calculations at its input sample rate, whether or not it is performing decimation. When block 43 is decimating, the following programmable processor block 44 merely takes in its input samples at its lower sample rate. Alternatively, additional means could be provided in filter processor block 43 to cause it to calculate at the lower sample rate when it is decimating.

The selection of a set of coefficients to be loaded from coefficient memory 52 into FIR filters 50 and 51 is determined by a SELECT signal provided to coefficient memory 52.

Dual FIR filters 50 and 51 preferably use the exact same configuration and the same set of coefficients within any particular operating mode (i.e., they preferably have even symmetry). In a preferred embodiment, each filter may use a plurality of taps and the filter coefficients are quantized to about 16-bit two's-compliment numbers.

Programmable processor block 44 is shown in greater detail in FIG. 6. A reduced instruction set (RISC) digital signal processor is shown. It employs executable code for each of the AM, FM, and audio modes. The I and Q or left and right inputs are supplied to a limiting function 55 for removing any undesirable amplitude modulation. The outputs of limiting function 55 are coupled to respective inputs of a multiplexer 56. The output of multiplexer 56 is connected to an input of a Y-RAM memory section.

The output of Y-RAM 57 is also coupled to respective inputs on multiplexers 58 and 59. Multiplexer 58 has its output connected to an Xr input of a multiplier-accumulator 60. Multiplexer 59 has its output connected to a Yr input of multiplier-accumulator 60. The output of Y-RAM 57 is also coupled to an input of a program sequencer 61.

Multiplier-accumulator 60 has its output coupled to respective inputs of multiplexers 56, 58, and 59. The output of multiplier-accumulator 60 is also coupled to an X-RAM memory unit 62, a function calculator block 63, and program sequencer 61. The two separate output lines from multiplier-accumulator 60 represent separate bit sections of the output from multiplier-accumulator 60.

An X address unit 64 receives a RESET input signal which is also supplied to program sequencer 61. Address unit 64 is coupled to X-RAM 62 for controlling addressing of X-RAM 62. Program sequencer 61 is also connected to address unit 64 for controlling addressing of X-RAM 62. For example, address unit 64 may include an offset counter and a base counter as is known in the art. The offset counter may be controlled by program sequencer 61 so that appropriate data is coupled to multiplexer 58 and to multiplier-accumulator 60, as dictated by the processor algorithms used.

A multiplexer 65 receives inputs from program sequencer 61 and a pair of external address inputs. The output of multiplexer 65 is connected to Y-RAM 57 to control addressing of Y-RAM 57.

A pair of external data inputs are coupled to multiplexer 56. The external data inputs and external address inputs facilitate initializing and configuring of programmable processor block 44. In addition, the SELECT signal is provided to program sequencer 61 to place program sequencer 61 in a desired mode.

Multiplier-accumulator 60 is connected to three output registers R1, R2, and R3. Register R1 provides a main output signal which is the FM multiplex (MPX) signal when in FM mode and is the L+R signal in AM mode. When in audio mode, register R1 provides one of the left or right stereo signal outputs.

Register R2 provides a secondary output which is not used in FM mode. In AM mode, this output contains the L-R signal for AM stereo. In audio mode, register R2 contains the remaining left or right audio signal.

Register R3 provides a signal strength output signal which is generated in a known manner and which is used as an indicator of signal reception quality.

In operation, programmable processor block 44 uses well known DSP techniques for operating on various digital signals to perform filtering, signal detection and/or decimation. Function block 63 is a hard-wired sub-block which takes a 32-bit output from multiplier-accumulator 60 and provides a 16-bit output to Y-RAM 57. Function block 63 can be configured by program sequencer 61 to provide iterative functions such as division or other mathematical functions that are used in detection or other processing of the digital signals.

When in FM mode, data is written out of register R1 at the sample rate used for the FM mode. When in AM mode, data is written from registers from R1 and R2 at a reduced sample rate. The outputs are coupled to further processing blocks (not shown), that perform stereo detection and other conventional functions.

Figure 7:
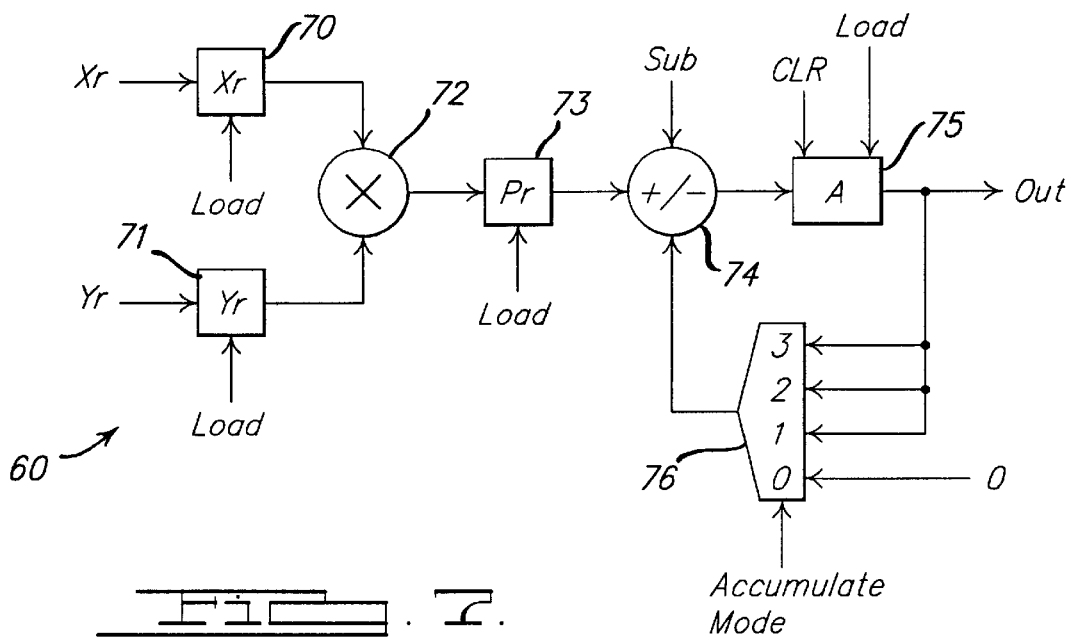
FIG. 7 is a block diagram showing the multiplier-accumulator of FIG. 6 in greater detail.

Multiplier-accumulator 60 is shown in greater detail in FIG. 7. This 16×16-bit pipeline multiplier and 32-bit accumulator/subtractor forms the product of values loaded into an Xr register 70 and a Yr register 71 under control of load signals from the program sequencer. A multiplier 72 places the resulting product in a Pr register 73 under coordination of another load signal from the program sequencer. The output of PR register 73 is coupled to an input of a summer 74. Summer 74 performs addition or subtraction depending on the value of a SUB control signal which is provided by the program sequencer. The output of summer 74 is connected to an accumulator register 75. Under control of the program sequencer, "A" register 75 can be cleared or can load the value from summer 74. It supplies the output of multiplier-accumulator 60 and is also coupled to several inputs of a multiplexer 76. Multiplexer 76 can feed back portions of the output from register 75 to a second input of summer 74 depending upon an "accumulate mode" control signal from the program sequencer.

Figure 8:
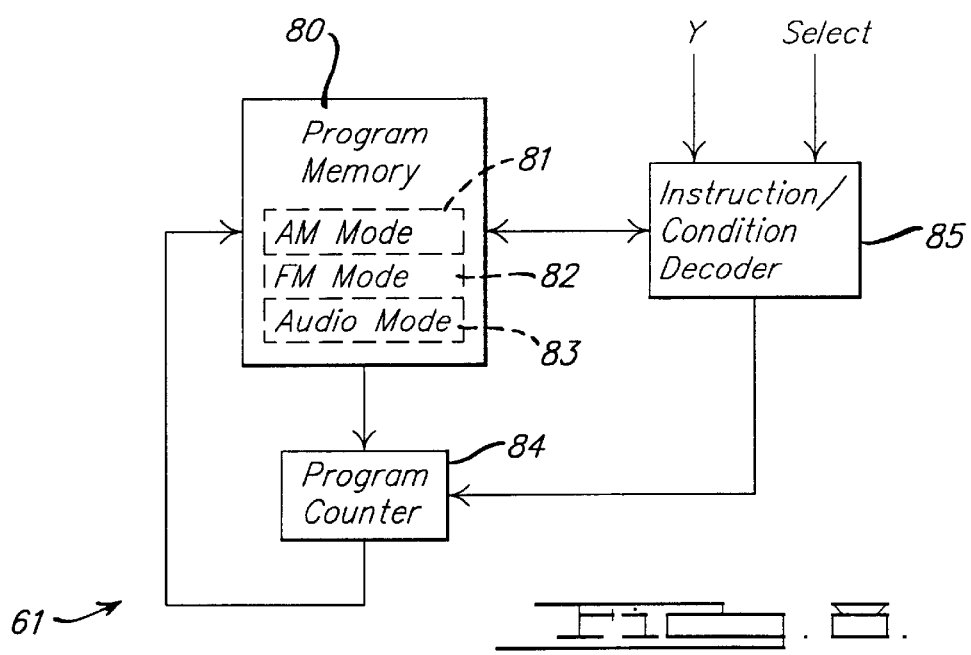
FIG. 8 is a block diagram showing the program sequencer of FIG. 6 in greater detail.

Program sequencer 61 is shown in greater detail in FIG. 8. A program memory 80 stores executable code for the programmable processor block and includes separate executable code sections 81, 82, and 83 for AM mode, FM mode, and audio mode, respectively. Program memory 80 is connected to a program counter 84 and an instruction/condition decoder 85. The SELECT signal places the program sequencer in a desired mode, such as the AM, FM, and audio modes or an initialization mode wherein data and instructions are loaded into RAM. Decoder 85 is also responsive to the output of Y-RAM to process conditional instructions, as is known from conventional processing.

By means of the separate executable sections of program memory 80, the programmable processor block adapts to the appropriate AM, FM, or audio mode, including operating at various sample rates as appropriate. Therefore, a highly efficient DSP architecture is obtained for providing processing of multiple radio reception bands as well as for prerecorded audio.

What is claimed is:

1. A digital signal processor for a multiband radio receiver that processes audio signals from a radio tuner including a narrowband IF signal from a first broadcast band and a wideband IF signal from a second broadcast band, said digital signal processor comprising:

a half-complex mixer block selectably responsive to said narrowband IF signal when said processor is in a narrowband mode or said wideband IF signal when said processor is in a wideband mode to generate a digital complex IF signal at a predetermined IF frequency and at a first sample rate, said complex IF signal including an in-phase component and a quadrature-phase component;

a decimator block with dual sections coupled to said half-complex mixer block, each section of said decimator block decimating a respective one of said in-phase component and said quadrature-phase component of said complex IF signal by a predetermined ratio to produce a sample-rate reduced complex IF signal at a second sample rate;

a reconfigurable digital filter block with dual sections, each section of said digital filter block having selectable sets of filter coefficients including a first set corresponding to said narrowband mode and a second set corresponding to said wideband mode, said first set of filter coefficients configuring said digital filter block as a decimator to further reduce the sample rate of said sample-rate reduced complex IF signal to a third sample rate when in said narrowband mode, and said second set of filter coefficients configuring said digital filter block as a channel lowpass filter to reject undesired signals from said sample-rate reduced complex IF signal without further sample rate reduction when in said wideband mode; and a programmable processor block receiving outputs from said dual sections of said digital filter block, said programmable processor block including a program memory and a program sequencer, said program memory containing a first executable code block for use in said narrowband mode and a second executable code block for use in said wideband mode, said first executable code block performing a channel filtering and narrowband detection function at said third sample rate, and said second executable code block performing a wideband detection function at said second sample rate.

2. The digital signal processor of claim 1 wherein said first broadcast band is AM and said second broadcast band is FM.

3. The digital signal processor of claim 1 wherein oversampled stereo audio signals from a playback of prerecorded media are respectively coupled to said dual sections of said decimator block for decimation, and wherein said digital filter block and said programmable processor block each have an audio mode for further decimating said stereo audio signals.

4. The digital signal processor of claim 1 wherein said predetermined IF frequency is substantially zero hertz.

5. The digital signal processor of claim 1 wherein said programmable processor block further includes a multiplier-accumulator and a function calculator operating under control of said first or second executable code block.

* * * * *